(12) United States Patent
Smith

(10) Patent No.: US 7,602,927 B2
(45) Date of Patent: Oct. 13, 2009

(54) GUITAR AMPLIFIER WITH CHANNEL-DEDICATED POWER SWITCHING

(75) Inventor: Randall C. Smith, Petaluma, CA (US)

(73) Assignee: Mesa/Boogie, Ltd., Petaluma, CA (US)

( * ) Notice: Subject to any disclaimer, the term of this patent is extended or adjusted under 35 U.S.C. 154(b) by 1004 days.

(21) Appl. No.: 10/936,152

(22) Filed: Sep. 7, 2004

(65) Prior Publication Data

US 2006/0050900 A1  Mar. 9, 2006

(51) Int. Cl.
*H03F 99/00* (2009.01)
*H03F 1/14* (2006.01)
*H03F 3/68* (2006.01)
*G10H 1/00* (2006.01)
*H04R 3/00* (2006.01)
*G10H 1/06* (2006.01)
*G10H 1/12* (2006.01)

(52) U.S. Cl. .................. 381/120; 381/118; 381/123; 84/735; 84/736; 330/51; 330/124 R

(58) Field of Classification Search ............... 381/118, 381/120, 123, 61–63; 84/735, 736; 330/51, 330/10, 124 R, 276.1
See application file for complete search history.

(56) References Cited

U.S. PATENT DOCUMENTS 4,593,251 A * 6/1986 Smith .................. 330/123
6,522,752 B1 * 2/2003 Smith .................. 381/61

* cited by examiner

*Primary Examiner*—Devona E Faulk
(74) *Attorney, Agent, or Firm*—White & Case LLP

(57) ABSTRACT

An amplifier for electric guitar including a plurality of foot switch selectable preamplifier channels which can be set to provide differing sonic characteristics, and also including a power amplifier section for driving a loudspeaker that can be switched between at least two different power or performance capabilities. User operable switching dedicated to at least one of the preamplifier channels is provided to select preferred power amplifier parameters in conjunction with differing channel voicings. Thus, differing preferred power amplifier characteristics may be pre-set and assigned to individual preamplifier channels and called up automatically in conjunction with the remote channel selection.

19 Claims, 2 Drawing Sheets

GUITAR AMPLIFIER WITH CHANNEL-DEDICATED POWER SWITCHING

FIELD OF THE INVENTION

This invention relates to audio amplifiers primarily for use with an electric guitar.

BACKGROUND AND DESCRIPTION OF THE PRIOR ART

The electric guitar is an instrument with a very wide musical vocabulary. A large part of the electric guitar musical versatility derives from the varying sonic characteristics that may be provided by modern amplification. Unlike the piano, which also can play a wide variety of musical styles, yet always retains the same timbre for each style, the sound of the electric guitar emanates solely from the amplifier and its associated loudspeaker. Moreover, the guitar amplifier is no longer expected to operate exclusively in the linear domain, faithfully reproducing the original "acoustic" sound of the plucked strings.

Instead, the role of the modern guitar amplifier has expanded to include saturation distortion, an expressive sonic enhancement that is so vital to certain popular musical styles that they could not otherwise be created. In fact, some musical styles have arisen after the fact, in response to, and as a result of a particular amplifier's characteristics of sound distortion.

As examples, there is simply no way that searing, sustaining, single-note lead lines could have been played without a major dose of amplifier saturation. Over time, as amplifier over-drive characteristics became more extreme, the musical styles they spawned have become increasingly aggressive as illustrated by the entire genre of "heavy metal" and its various stylistic subsets, many of which are closely, if not nearly exclusively, the domain of certain models and settings of amplifiers and their distortion tonalities.

The origin of the modern distortion-enhancement amplifier dates to the "dual mode" circuit described in U.S. Pat. No. 4,211,893 of Randall C. Smith which provides a "lead mode" as well as the traditional "rhythm mode", each being pre-settable and foot-switch selectable. In this design, extra stages of pre-amplification are cascaded such that massive overdrive saturation creates distortion that can go far beyond merely mimicking the sound of an amplifier "turned up too loud".

However, the sound of a good vacuum tube amplifier "turned up too loud" must be acknowledged as the historical source of musical distortion for electric guitar. First used by blues players (who set the stage for the rock and rollers that followed), power amplifier distortion became a powerfully expressive tool.

The fundamental limitation of power amplifier distortion is its inseparable relation to amplifier loudness. Indeed, the distortion occurs only when, and as a result of, the amplifier being "turned up too loud". One of the benefits of the amplifier of the above noted patent was its ability to separate playing loudness from distortion characteristics and this was accomplished by providing for massive, controllable saturation generated within the preamplifier, then providing user attenuation of the signal amplitude before coupling it to the power section. Though this approach can mimic power amplifier distortion (and more), it is not truly the same thing and differs in many respects.

First, unlike preamplifiers, power amplifiers are nearly all audio amplifiers are push-pull amplifiers. Second, power amplifiers almost all utilize pentode or beam power tubes, compared to the small triodes of the preamplifier. Third, power amplifiers couple through an output transformer to the loudspeaker. Fourth, there will always remain an abiding opinion that power amplifier distortion is more "legitimate" than preamplifier distortion, due to its historical roots.

Thus, despite the versatility provided by preamplifier distortion, there remains a strong need for providing authentic power amplifier distortion while remedying the age-old limitations presented by its link to playing loudness.

SUMMARY OF THE INVENTION

The amplifier of the present invention provides at least two user selectable output power levels in conjunction with a plurality of preamplifier channels and further provides switching such that the preferred output capability which best complements each channel's preamplifier setting can be assigned and automatically synchronized to the channels as they are selected during a performance.

In a typical embodiment of the present invention, the output amplifier would include four power vacuum tubes arranged in a push-pull parallel configuration. In its full power setting, all four vacuum tubes would be operable for maximum undistorted headroom. This is the power setting that would best complement a preamplifier channel set for a pure, clean style of playing.

A second preamplifier channel may be set with more gain and then be coupled to the power section alternately configured to operate this time on only a single pair of push-pull output tubes capable of delivering only about half the power of the previous setting. This enables the musician to generate desirable power amplifier distortion at a playing loudness that, while reduced from the maximum possible, actually better matches it in perceived loudness. This is because the amplifier stages, as they are driven increasingly hard into clip, progressively compress the dynamic peaks of the musical material. Thus, a less powerful output section that is driven harder can better match the loudness of a higher power section which is not overdriven and which is fed a more dynamic signal, such as is the case with clean picking or chording.

Amplifiers with more than two preamplifier channels (or modes) and/or more than two power output capabilities may, of course, utilize the channel-dedicated power amplifier switching of the present invention in a more expanded fashion as well as the amplifiers with only two preamplifier channels or two operational modes.

DESCRIPTION OF THE PREFERRED EMBODIMENT

Figure 1:
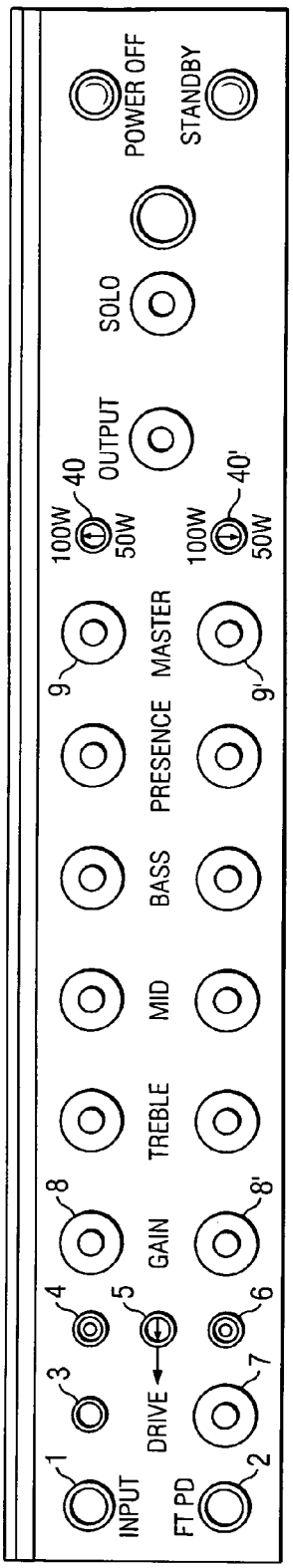
FIG. 1 is an illustration of the control panel of a two-channel guitar amplifier showing the control features for a typical (and minimal) embodiment of the present invention.

Referring to FIG. 1, at the left side of the panel are two jacks, one for input of the electric guitar signal 1 and another for the foot switch that remotely controls channel selection 2. To the right of the input jack 1 is a small LED 3 to indicate when the upper channel is active. Arranged in a vertical column are three small toggle switches, the upper switch 4 manually selecting between the channels, the middle switch 5 altering the performance mode of Channel 2 and the lower switch 6 altering the tone control frequencies for Channel 2.

The two preamplifier channels of the amplifier of FIG. 1 have their respective controls arranged horizontally with Channel 1 above Channel 2 as shown by the treble, mid, bass and presence knobs. As the panel drawing shows, the controls are for the most part duplicated between the channels to simplify learning and operating the amplifier. There is one significant difference between the channels, however, and that is the inclusion of the DRIVE control 7 which is optionally functional for Channel 2. When DRIVE is selected (via the toggle switch 5), a high gain saturation circuit is coupled in line with preamplifier Channel 2 in order to provide distortion enhancement that is then controllable by the combination of DRIVE control 7 and GAIN control 8' settings. Signal output amplitude for the channels is adjustable by the respective MASTER controls 9, 9'.

Next to each channel MASTER control is located a toggle switch 40, 40' which provides the musician with the choice of two different wattage capabilities for the power amplifier, such as, for example, 100 watts or 50 watts. These are the Channel dedicated power switches of the present disclosure.

It can be seen that the control parameters of both of the preamplifier channels may be set independently whether or not DRIVE is selected. When the DRIVE mode option is de-selected, Channels 1 and 2 then have similar gain structures and responses. This provides for two widely divergent settings of the two similar channels that may be further enhanced by the ability to select differing power amplifier capabilities for each channel. For the more traditional player, Channel 1 would be configured for an entirely clean, distortion-free preamplifier coupled to the higher wattage (e.g. 100 watt) maximum headroom power setting.

Channel 2 could then be set for more preamplifier gain (with or without engaging the DRIVE feature) and coupled to the power amplifier with its output capability reduced to the lower wattage (e.g. 50 watts). This provides the musician with both the capabilities of a higher wattage (e.g. 100 watts) clean amplifier and a lower wattage (e.g. 50 watts) blues amplifier, both of which are highly desirable, well balanced to one another and alternately selectable during a performance within a single amplifier package. Other controls and switches on the front panel are typical and do not directly involve the invention of the present disclosure.

Figure 2:
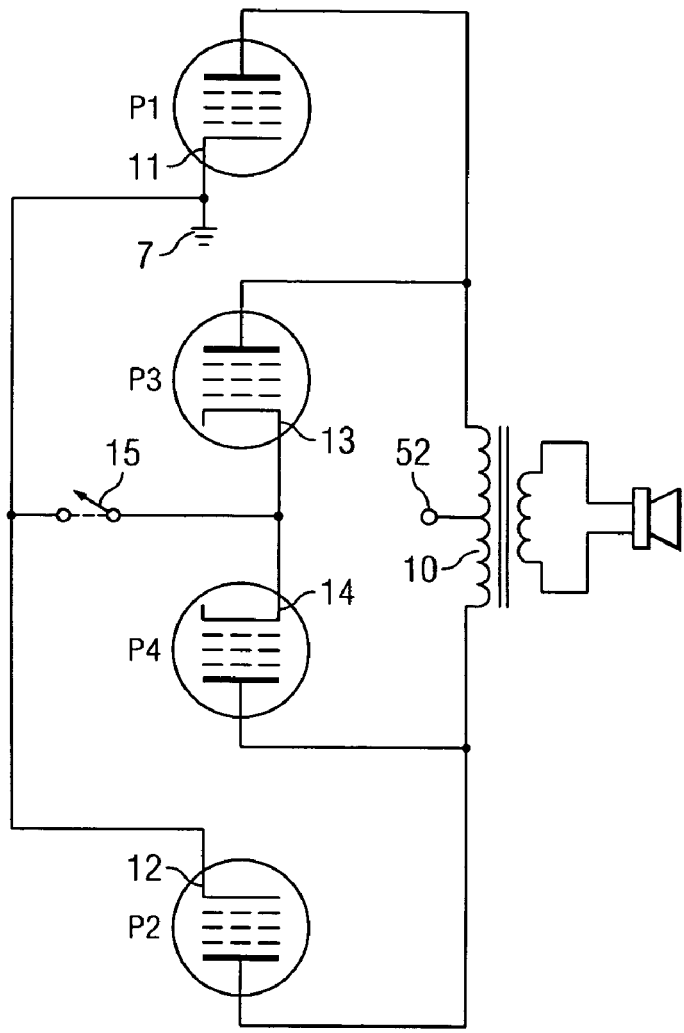
FIG. 2 is a simplified schematic diagram illustrating the control circuitry for the amplifier of FIG. 1.

FIG. 2 is a schematic diagram of a simplified two-channel switching circuit including the channel dedicated power switching of the present invention. Two pairs of power pentodes, P1, P2 and P3, P4 are coupled to the primary winding 10 of an output transformer whose center tap 52 is fed from a high voltage power supply (not shown). Each of power pentodes P1, P2, P3, and P4 is a vacuum tube electron conducting device having an electron emitter (cathode), and electron collector (plate) and a control element (control grid) to control electron flow from cathode to plate. The cathodes 11, 12 of the first pair of power tubes P1, P2 are coupled to ground 1. The cathodes 13, 14 of the second pair of power tubes P3, P4 are tied together and coupled to a switch 15 such that they may be isolated from ground 1 (as shown) or connected to ground 1 when the switch 15 is closed, as indicated by the dashed line. With switch 15 in the open position as shown, the power section operates on a single pair of power tubes P1, P2 for half power. With the switch 15 closed, full power capability is alternately provided as the second pair of power tubes P3, P4 have their respective cathodes 13, 14 coupled to ground 1.

Figure 3:
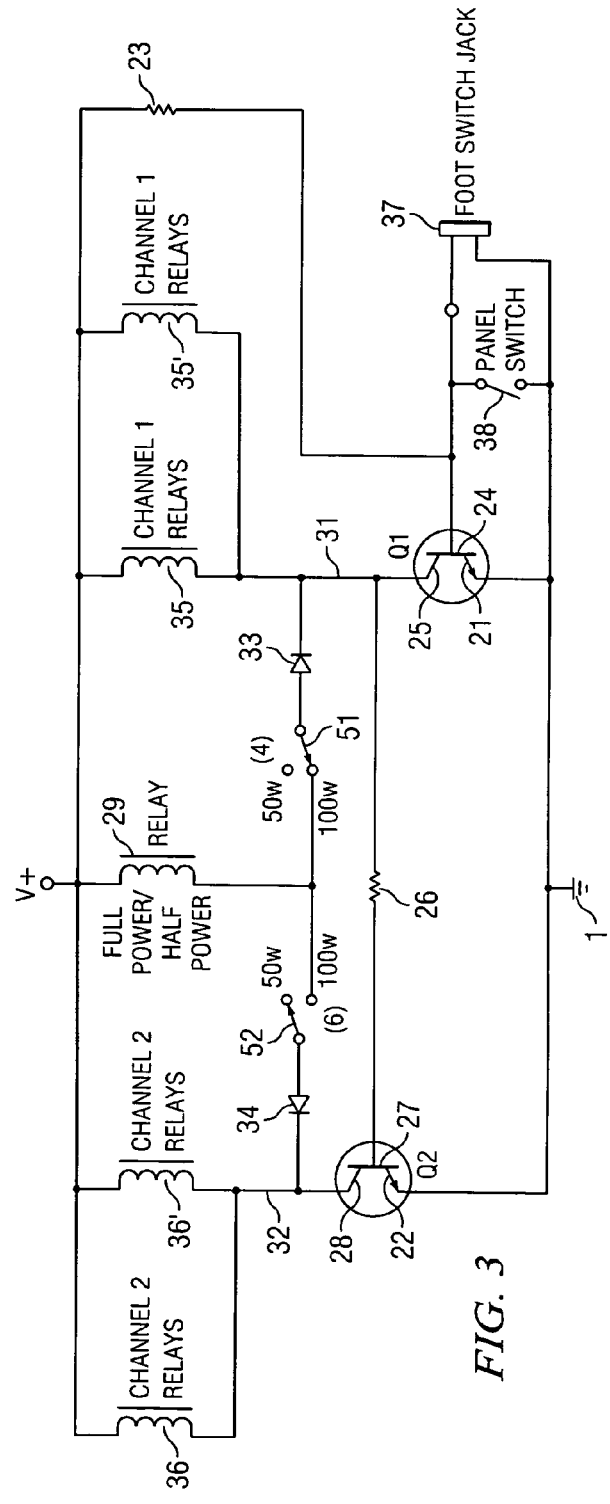
FIG. 3 is a diagram of a circuit that can be used as the switch 15 of FIG. 2.

As shown in FIG. 3, switch 15 of FIG. 2 may be a coil-operated relay circuit whose action can then be dedicated to either or both of the two preamplifier channels by the adjacent control circuitry. The circuit includes NPN bipolar transistors Q1 and Q2 with their emitters coupled to ground 1. A pull-up resistor 23 couples positive voltage to base 24 of transistor Q1. With its base 24 biased high, transistor Q1 conducts current through the relay coils 35, 35' that activate the circuitry of Channel 1, to the V+supply. Because the collector 25 of transistor Q1 is coupled through isolation resistor 26 to the base 27 of transistor Q2, the collector 28 of transistor Q2 is simultaneously held in a high state and does not conduct current through the relay coils 36, 36' of Channel 2.

When either the foot switch 37 or the panel switch 38 is operated to apply ground to the base 24 of transistor Q1, the base 24 of transistor Q1 goes low, opening the collector 25-emitter 21 path and de-energizing the coils of Channel 1. Simultaneously, the base 27 of transistor Q2 is biased high through the resistor 26 and relay coils 35, 35' of channel 1, thus turning on transistor Q2 such that current then flows across the emitter 22-collector 28 junction, activating the relay coils 36, 36' for Channel 2.

The full-power/half-power relay coil 29 may be coupled to the channel relay busses 31, 32 through blocking diodes 33, 34 and the amplifier panel switches 4 and 6 for the respective channels. The blocking diodes maintain isolation between the channel busses 31, 32 while providing dedicated coupling of the power selecting relay 29 to operate in conjunction with the selection of neither, either or both channels. As shown in both FIG. 1 and FIG. 2, the amplifier embodiment of the present invention can provide high power (e.g. 100 watts power) when Channel 1 is selected and can provide low power (e.g. 50 watts) when Channel 2 is selected.

Figure 4:
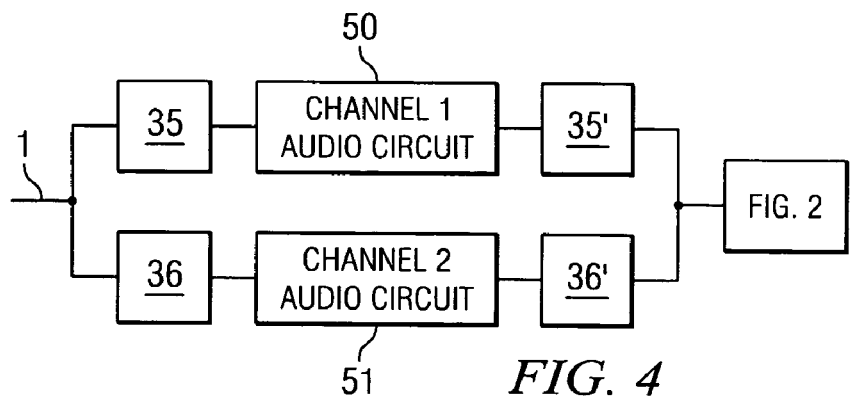
FIG. 4 is a block diagram of a guitar amplifier circuit in accordance with the present invention.

Referring now to FIG. 4, there is shown a block diagram of a guitar amplifier in accordance with the present invention. There is shown the input 1 from the guitar, also shown in FIG. 1, which is fed to channels 1 and 2. When the channel 1 relays 35, 35' of FIG. 3 allow the signal to travel to the channel 1 circuitry 50, channel 2 relays 36, 36' inhibit the signal from travel to the channel 2 circuitry 51 and vice versa. The output of operational one of the channels travels to the circuitry of FIG. 2 and is applied to the control grids of the respective vacuum tubes P1, P2 and P3, P4 in standard manner. In this way, the circuitry of channel 1 or channel 2, which are preamplifier sections, can be selected along with the power amplifier section which includes vacuum tubes P1 and P2 alone or in combination with vacuum tubes P3 and P4 to provide the improvements discussed above. The circuitry 50 and 51 could include any standard guitar preamplifier circuitry such as, for example, the circuitry of the above mentioned patent.

Though the invention has been described with respect to a specific preferred embodiment thereof, many variations and modification will immediately become apparent to those skilled in the art. It is therefore the intention that the appended claims be interpreted as broadly as possible in view of the prior art to include all such variations and modification.

The invention claimed is:
1. A guitar amplifier comprising:
an output device;
an input terminal;
a power amplifier section coupled to said output device capable of providing a plurality of power levels;
a plurality of preamplifier channels connected in parallel and coupled to said power amplifier section and said input terminal; and means to selectively activate one of said plurality of preamplifier channels and one of said plurality of power levels while concurrently deactivating the rest of said plurality of preamplifier channels.

2. The guitar amplifier of claim 1 wherein said means to selectively activate is configured to selectively activates one of said plurality of preamplifier channels and one of said plurality of power levels concurrently.

3. The guitar amplifier of claim 1 wherein said means to selectively activate is a manually-operated switch.

4. The guitar amplifier of claim 1 wherein said output device is a transformer winding having a pair of opposing ends.

5. The guitar amplifier of claim 2 wherein said output device is a transformer winding having a pair of opposing ends.

6. The guitar amplifier of claim 1 wherein said plurality of preamplifier channels is two, each of said plurality of preamplifier channels having a different audible characteristic.

7. The guitar amplifier of claim 2 wherein said plurality of preamplifier channels is two, each of said plurality of preamplifier channels having a different audible characteristic.

8. A guitar amplifier comprising:
an input terminal;
an output device;
a push-pull power amplifier circuit having a plurality of stages and coupled to said output device;
a first preamplifier channel and a second preamplifier channel, said first preamplifier channel and said second preamplifier channel each selectively couplable to said input terminal and said push-pull power amplifier circuit; and
switch means configured to selectively electrically decouple one of said plurality of stages from said push-pull power amplifier circuit;
wherein each of said first preamplifier channel and said second preamplifier channel is concurrently selectable with one of said plurality of stages of said push-pull power amplifier circuit.

9. The guitar amplifier of claim 8, wherein said push-pull power amplifier circuit comprises:
a first pair of electron conducting devices, each having an electron emitter, an electron collector, and a control element to control electron flow between said electron emitter and said electron collector, the electron collector of each of said first pair of electron conducting devices coupled to said output device, each electron emitter of each of said first pair of electron conducting devices coupled to a reference source; and
a second pair of electron conducting devices, each having an electron emitter, an electron collector, and a control element to control electron flow between said electron emitter and said electron collector, the electron collector of each of said second pair of electron conducting devices coupled to said output device, each electron emitter of each of said second pair of electron conducting devices configured to be coupled to a reference source;
said switch means configured to selectively decouple said second pair of electron conducting devices from said push-pull power amplifier circuit and selectively couple one of said first preamplifier channel and said second preamplifier channel to said output device and selectively decouple the other of said first preamplifier channel and said second preamplifier channel from said output device.

10. The guitar amplifier of claim 9 wherein said switch means is configured to selectively decouple said second pair of electron conducting devices by decoupling the electron emitter of each of said second pair of electron conducting devices from said reference source.

11. The guitar amplifier of claim 8 wherein said output device includes a transformer winding having a pair of opposing ends.

12. The guitar amplifier of claim 9 wherein said output device includes a transformer winding having a pair of opposing ends.

13. The guitar amplifier of claim 10 wherein each of said first pair of electron conducting devices and said second pair of electron conducting devices are a pair of vacuum tubes, and one vacuum tube from each of said pairs of vacuum tubes is coupled to a different one of said opposing ends of said transformer winding.

14. The guitar amplifier of claim 11 wherein each of said first pair of electron conducting devices and said second pair of electron conducting devices are a pair of vacuum tubes, and one vacuum tube from each of said pairs of vacuum pairs is coupled to a different one of said opposing ends of said transformer winding.

15. The guitar amplifier of claim 9 wherein said switch means includes a first switch configured to selectively decouple said second pair of electron conducting devices from said push-pull power amplifier circuit and selectively couple one of said first preamplifier channel and said second preamplifier channel to said output device and selectively decouple the other of said first preamplifier channel and said second preamplifier channel from said output device.

16. A guitar amplifier comprising:
an output device;
an input terminal;
a power amplifier section coupled to said output device capable of providing a plurality of power levels;
a plurality of preamplifier operational modes capable of providing differing performance characteristics and coupled to said power amplifier section and said input terminal; and
means to selectively activate one of said plurality of preamplifier operational modes and one of said plurality of power levels while concurrently deactivating the rest of said plurality of preamplifier operational modes.

17. The guitar amplifier of claim 16 wherein said means is a manually-operated switch.

18. The guitar amplifier of claim 16 wherein said output device is a transformer winding having a pair of opposing ends.

19. The guitar amplifier of claim 17 wherein said output device is a transformer winding having a pair of opposing ends.

* * * * *